United States Patent
Rothe

(10) Patent No.: US 10,236,666 B2
(45) Date of Patent: Mar. 19, 2019

(54) AIR CONDITIONING ARRANGEMENT

(71) Applicant: FRIEDRICH LUETZE GMBH, Weinstadt-Grossheppach (DE)

(72) Inventor: Elmar Rothe, Erfurt (DE)

(73) Assignee: FRIEDRICH LUETZE GMBH, Weinstadt-Grossheppach (DE)

( * ) Notice: Subject to any disclaimer, the term of this patent is extended or adjusted under 35 U.S.C. 154(b) by 10 days.

(21) Appl. No.: 15/314,127

(22) PCT Filed: May 27, 2015

(86) PCT No.: PCT/EP2015/001090
§ 371 (c)(1),
(2) Date: Apr. 5, 2017

(87) PCT Pub. No.: WO2015/180843
PCT Pub. Date: Dec. 3, 2015

(65) Prior Publication Data
US 2017/0229846 A1   Aug. 10, 2017

(30) Foreign Application Priority Data

May 27, 2014   (DE) ........................ 10 2014 007 901

(51) Int. Cl.
*H02B 1/56*   (2006.01)
*H05K 7/20*   (2006.01)

(52) U.S. Cl.
CPC ............ *H02B 1/565* (2013.01); *H05K 7/202* (2013.01); *H05K 7/20572* (2013.01); *H05K 7/20609* (2013.01)

(58) Field of Classification Search
CPC ................. H05K 7/202; H05K 7/2536; H05K 7/20554–7/20563; H05K 7/206–7/20609; H05K 7/20536; H02B 1/565
See application file for complete search history.

(56) References Cited

U.S. PATENT DOCUMENTS 2,446,946 A * 8/1948 Morton ................. F25D 11/022
                                                                62/447
2,557,750 A * 6/1951 McCloy ................. F25D 11/025
                                                                62/227

(Continued)

FOREIGN PATENT DOCUMENTS

DE         29823784 U1 * 11/1999 ............. F25D 21/14
DE  10 2006 055 755         4/2008

(Continued)

OTHER PUBLICATIONS

International Search Report (ISR) dated Jul. 7, 2015 in International (PCT) Application No. PCT/EP2015/001090.

*Primary Examiner* — Robert J Hoffberg
(74) *Attorney, Agent, or Firm* — Wenderoth, Lind & Ponack, L.L.P.

(57) ABSTRACT

An air conditioning arrangement, in particular a cooling arrangement, includes a switchgear cabinet (1) having a supporting device (4). Electric and/or electronic devices (2) to be air-conditioned are disposed in rows on top of and next to one another on the front side (17) of the supporting device (4). The front side (17) faces the doors of the switchgear cabinet. The devices (2) in the switchgear cabinet (1) can be at least partially air-conditioned by at least one heat sink (50), forming an autonomous component.

12 Claims, 4 Drawing Sheets

(56) References Cited

U.S. PATENT DOCUMENTS

| | | | | |
|---|---|---|---|---|
| 2,992,545 | A * | 7/1961 | Walker | F25B 39/024 126/672 |
| 3,387,648 | A * | 6/1968 | Ward, Jr. | H05K 7/20572 165/104.33 |
| 3,749,981 | A * | 7/1973 | Koltuniak | H02B 1/565 165/104.34 |
| 5,105,336 | A * | 4/1992 | Jacoby | H05K 7/20127 361/678 |
| 5,638,694 | A * | 6/1997 | Banicevic | F25D 21/04 62/277 |
| 6,742,583 | B2 * | 6/2004 | Tikka | H05K 7/206 165/261 |
| 7,821,268 | B2 * | 10/2010 | Albrecht | G01R 33/28 324/318 |
| 8,947,879 | B2 * | 2/2015 | Broome | H05K 7/1497 165/104.33 |
| 2005/0061013 | A1 * | 3/2005 | Bond | G06F 1/183 62/259.2 |
| 2011/0171373 | A1 * | 7/2011 | Lee | C09K 5/14 427/160 |
| 2012/0006505 | A1 * | 1/2012 | Trojer | H05K 7/206 165/48.1 |
| 2012/0085122 | A1 * | 4/2012 | Thour | H05K 7/206 62/419 |
| 2014/0246169 | A1 | 9/2014 | Perrin et al. | |
| 2014/0260397 | A1 * | 9/2014 | Agnaou | H02B 1/565 62/259.2 |
| 2015/0000328 | A1 * | 1/2015 | Kim | F28F 1/12 62/440 |
| 2015/0145391 | A1 * | 5/2015 | Broome | H05K 7/1497 312/236 |

FOREIGN PATENT DOCUMENTS

| | | | | |
|---|---|---|---|---|
| DE | 102007054724 B4 * | 2/2011 | | H05K 7/20609 |
| DE | 10 2009 054 011 | 3/2012 | | |
| DE | 10 2012 007 089 | 10/2013 | | |
| DE | 102014223537 A1 * | 5/2016 | | H02B 1/565 |
| DE | 102014223537 A1 * | 5/2016 | | H02B 1/565 |
| EP | 2 224 561 | 9/2010 | | |
| EP | 3024310 A2 * | 5/2016 | | H05K 7/20681 |
| WO | 2013/083421 | 6/2013 | | |

\* cited by examiner

AIR CONDITIONING ARRANGEMENT

FIELD OF THE INVENTION

The invention relates to an air conditioning system, in particular, a cooling system, which includes at least a switch cabinet having a support assembly. On the front side of the switch cabinet, facing the switch cabinet doors, electrical and electronic devices to be air conditioned are arranged in rows on top of and next to one another.

BACKGROUND OF THE INVENTION

A generic cooling system for electrical devices arranged in a switch cabinet is known from DE 10 2009 054 011 B4, including a switch cabinet having a support assembly. On the front side of the switch cabinet, the electrical devices are arranged in rows on top of and next to one another. An air conveying device, with which an air flow may be forced from top to bottom, is on the rear side of the support assembly, in which a partial air flow separated off from the air flow on the rear side of the support assembly may be fed in a targeted manner through multiple passage openings spaced apart from each other in a vertical direction and/or horizontal direction to the electrical devices to be cooled, which are arranged on the front side of the support assembly.

In this known solution in the installed switch cabinet, the support assembly includes horizontally arranged mounting strips, to which at least a portion of the devices is fastened. A strip gap exists between two mounting strips adjacent to one another in the vertical direction. In the area of the strip gap, the passage openings are arranged. The strip gap serves as a feed-through for the electrical connecting wires of the devices.

Electrical and/or electronic devices are frequently arranged in switch cabinets or switch boxes, in particular, in industrial control technology. During operation, the individual devices develop in part a significant heat loss, which results in a temperature increase inside the switch cabinet. To ensure the functionality of the devices, the temperature cannot exceed a maximum value. Thus, semiconductor components installed in the devices can only be operated in a functionally safe manner up to a component temperature of, for example, 85° C. or 125° C.

In developing the known solution according to DE 10 2009 054 011 B4, air flowing on the rear side of the switch cabinet and on the inner side thereof is comparatively cool, for example, because a cooling of the switch cabinet interior takes place via the rear wall of the switch cabinet, or because cool air is fed into this area, for example, via the inflow of cooler ambient air or via the inflow of air cooled by a heat exchanger. In addition, a passive cooling may take place as a result of heat emitted from the switch cabinet or as a result of cooling of the outer side of the switch cabinet by the ambient air.

The targeted guidance of cool air through the passage openings of the support assembly can disperse hotspots formed on the front side thereof, especially in the case in which the passage openings are arranged in the area of any forming hotspots. These hotspots can regularly occur between devices that are adjacent to one another as seen in a vertical direction. In addition, such hotspots may also form on the lee side of the devices disposed on the front side of the support frame, i.e., on the side of an electrical device facing away the air flowing on the front side of the support frame, which is in particular the case if the device is designed with a high volume or with a large surface area.

Thus, in the known solution, the passage openings may therefore preferably be arranged on the lee side of the devices, so that the cool air flowing through blows directly into the respective hotspot and thereby disperses the latter. Nevertheless, the known solution leaves room for improvement, in particular, as it concerns air conditioning efficiency, in particular, cooling efficiency.

SUMMARY OF THE INVENTION

An object of the invention is to provide an improved air conditioning system, in particular, a cooling system that not only operates very efficiently, but also allows for a compact design and is easy to maintain.

This object is basically achieved by an air conditioning system having electrical and/or electronic devices situated inside the switch cabinet being at least partially air conditioned and preferably cooled by a heat sink as an autonomous component in each case. An essentially homogenous temperature field may be achieved inside the switch cabinet despite varying thermal load emanating from the electrical and/or electronic devices. A uniform and yet efficient air conditioning of the devices is then achieved. The heat sink designed as an autonomous component can be implemented in the simplest embodiment as a "cold plate" in a cost-effective manner. Depending on its thermal state, the "cold plate" enables a homogenization of the temperature field inside the switch cabinet, in particular, in a cooling manner. The "cold plate", if it is made of a metal plate, is thermally conductive in an efficient manner. Starting from a cool baseline, for example, by storing a low ambient temperature outside the switch cabinet, the "cold plate" is able to transfer the low temperature into the interior of the switch cabinet for cooling the devices. A plate ("cold plate") cooled in this way allows, in particular, the switch cabinet air situated on the rear side of the support assembly to be guided in a falling manner from top to bottom along the rear side of the support assembly when the switch cabinet is installed, in order to then rise again on the front side of the support assembly under the influence of a convective heat flow caused by the heat dissipated from the devices. The devices are then correspondingly cooled.

The heat sink is therefore preferably a spatially limited autonomous body, which transfers the thermal energy stored inside it or fed to it to an adjacent medium, here in the form of air. The heat sink is preferably a cooling device, which dissipates waste heat to prevent the devices in the switch cabinet from overheating. In terms of air conditioning, such heat sink can also be used to warm the electrical and/or electronic devices, if necessary, in particular, if the devices are switched on in an extremely cold environment and in that respect only then put into operation.

The heat sink, which includes a plate-shaped extension to form a "cold plate", may form a wall section of the switch cabinet, preferably its rear wall. However, an option exists of integrating such plate-shaped heat sink inside the switch cabinet. Care should be taken, however, that the plate-shaped heat sink does not inhibit access to the tools when the switch cabinet doors of the switch cabinet are opened. Inhibiting access may be prevented, for example, by designing the plate-shaped heat sink as a component of each switch cabinet door.

Another option is to mount the heat sink on a building, in particular, on the wall sections of a hall or the like, in which the respective switch cabinet is installed, and then to install the switch cabinet in front of the building-engineered installed heat sink. In this way air conditioning of the interior of the switch cabinet is effected.

In another particularly preferred embodiment of the arrangement according to the invention, a predefinable distance is provided between the support assembly with the devices and heat sink to which they may be allocated, and is adjustable by an adjusting device. The thermal input load inside the switch cabinet may differ depending on how many and what type of devices are affixed to the support assembly. By adjusting the distance between the heat sink and the support assembly, the degree of the cooling capacity to be provided inside the switch cabinet may be adjusted.

For an optimized air flow of cool air inside the switch cabinet, the volume of the rear flow chamber is sized many times smaller than the volume of the front flow chamber to achieve an improved circulation inside the switch cabinet. The circulation of the flowing cool air or warm air may be effected by an air conveying device, preferably in the form of at least one cylindrical fan.

For more energy consuming, but better in terms of the cooling capacity to be produced, a gaseous coolant is introduced into circulation through cooling tubes inside the plate-shaped heat sink. In order in that way, heat may be dissipated from the interior of the switch cabinet into the environment. Any condensate forming on the heat sink can be collected by a collector device inside the switch cabinet and discharged from the switch cabinet into the environment by an outlet device or discharge device.

Other objects, advantages and salient features of the present invention will become apparent from the following detailed description, which, taken in conjunction with the drawings, discloses preferred embodiments of the present invention.

BRIEF DESCRIPTION OF THE DRAWINGS

Referring to the drawings that form a part of this disclosure and that are graphical and not to scale.

DETAILED DESCRIPTION OF THE INVENTION

Figure 1:
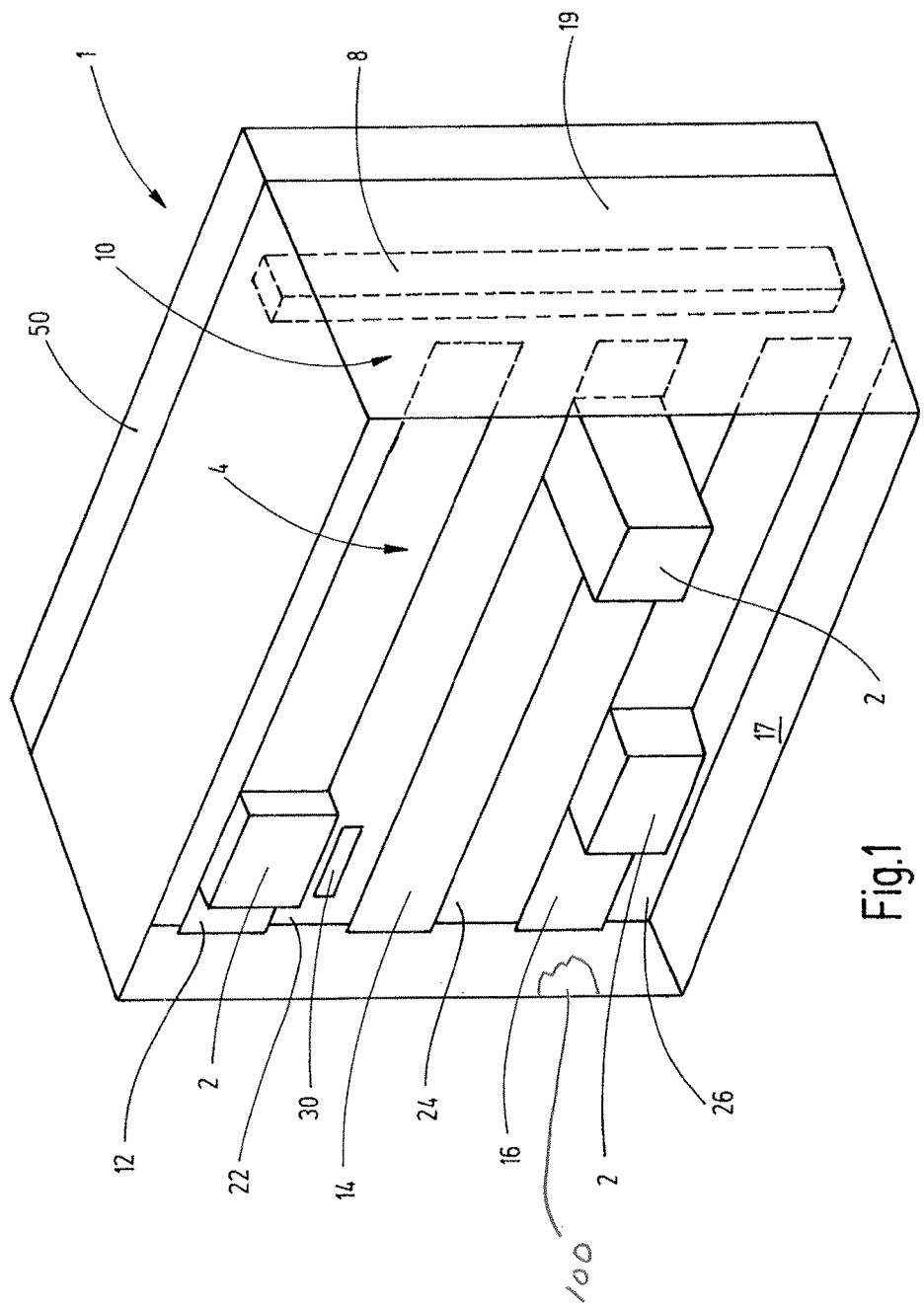
FIG. 1 is a perspective view of a switch cabinet according to an exemplary embodiment of the invention.

FIG. 1 shows a perspective view of a switch cabinet 1 according to an exemplary embodiment of the invention as it is used for mounting electrical and/or electronic devices 2 such as, for example, control devices, power supply units, switching devices, fuses, sensors, etc., preferably in industrial manufacturing technology. The technical specification switch cabinet is also intended to encompass devices, such as switch boxes as well as other receptacles for the aforementioned conventional type of devices 2.

Depicted only schematically in the switch cabinet 1 is a support assembly 4, which in the exemplary embodiment is composed of two or more vertically arranged or extending support rails 8 and, in the present case, a total of three essentially horizontally arranged mounting strips 12, 14, 16. The mounting strips 12, 14, 16 and the support rails 8 may be connected by connecting elements, for example, in the form of crossbars or the like, not depicted in FIG. 1. The mounting strips 12, 14, 16 are arranged in the direction of the front side 17 as seen in FIG. 1 in front of the support rails 8. The support rails 8 and the mounting strips 12, 14, 16 form a frame 10, which may also be preassembled accordingly and subsequently inserted into the switch cabinet 1 as support assembly 4 for the devices 2.

The devices 2 are arranged on the front side 17 of the mounting strips 12, 14, 16 and, therefore, on the front side 17 of the frame-like support assembly 4 in rows one on top of the other. They are preferably detachably fastened, in particular, on respective associated mounting strips 12, 14, 16. The front side 17 of the switch cabinet 1 may be closed by a switch cabinet door, not depicted in greater detail for reasons of simpler representation. The opening of the switch cabinet 1 may also be closed by a double door 100 or other multiple doors. An air flow 34 directed essentially from top to bottom, in the direction of the line arrows, may be forced on the rear side 19 of the support assembly 4, in particular, in the area of the support rails 8, by an air conveying device 20 (FIG. 2).

The strip gaps between the mounting strips 12, 14, 16 may be at least partially closed by closure elements 22, 24, 26. In the area of these strip gaps, electrical connecting wires of the devices 2 are passed from the front side 17 of the frame 10 to the rear side 19. In this respect, the wiring and cabling may extend accordingly on the rear side 19 of the frame-like support assembly 4. For this purpose, each of the closure elements 22, 24, 26 may be designed in multiple parts, and include, in particular, for example, a wiring strip 28 (FIG. 2) and a cover element 32. The closure elements as well as the wiring strip, in addition to the cover element, are reproduced merely by way of example, and only in a basic manner for purposes of simpler representation.

A passage opening 30 is arranged in the cover element 32, through which cooling air is able to enter from the rear side 19 to the front side 17 of the support assembly 4. In this way, cooling air may be fed to each heat-generating device 2 in a targeted manner. In the view according to FIG. 1, only the passage opening 30 for the uppermost depicted left device is visible. Nonetheless, one passage opening each for the second and third device 2 is also arranged in the second closure element 24 and in the third closure element 26. Instead of the solution demonstrated herein, however, the air may also be passed through every other opening from the rear side 19 to the front side 17 of the switch cabinet 1. In particular, the cooling air may be allowed to simply flow through between the horizontally arranged mounting strips 12, 14, 16.

Figure 2:
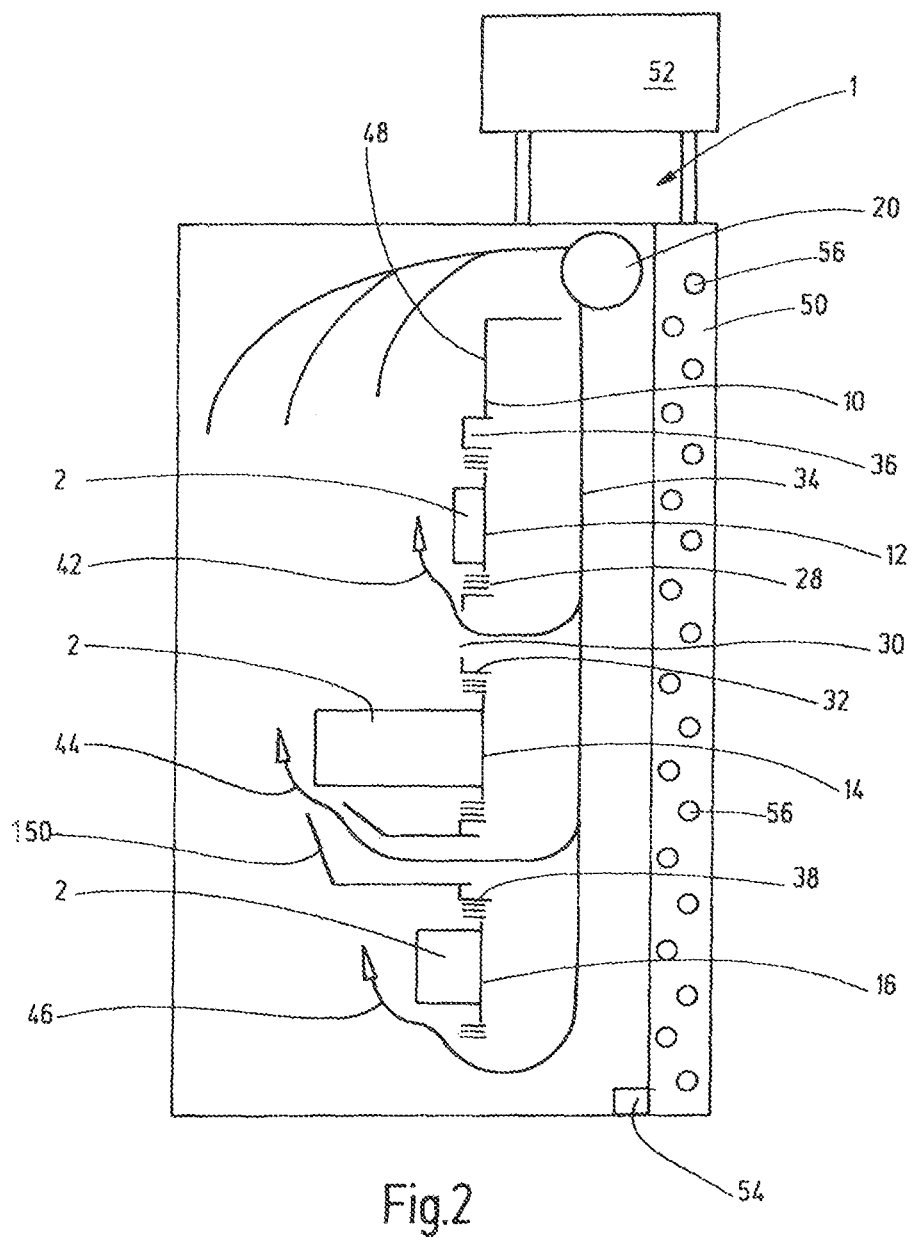
FIGS. 2 through 4 are side views of switch cabinets according to three different exemplary embodiments of the present invention as seen in FIG. 1.
Figure 3:
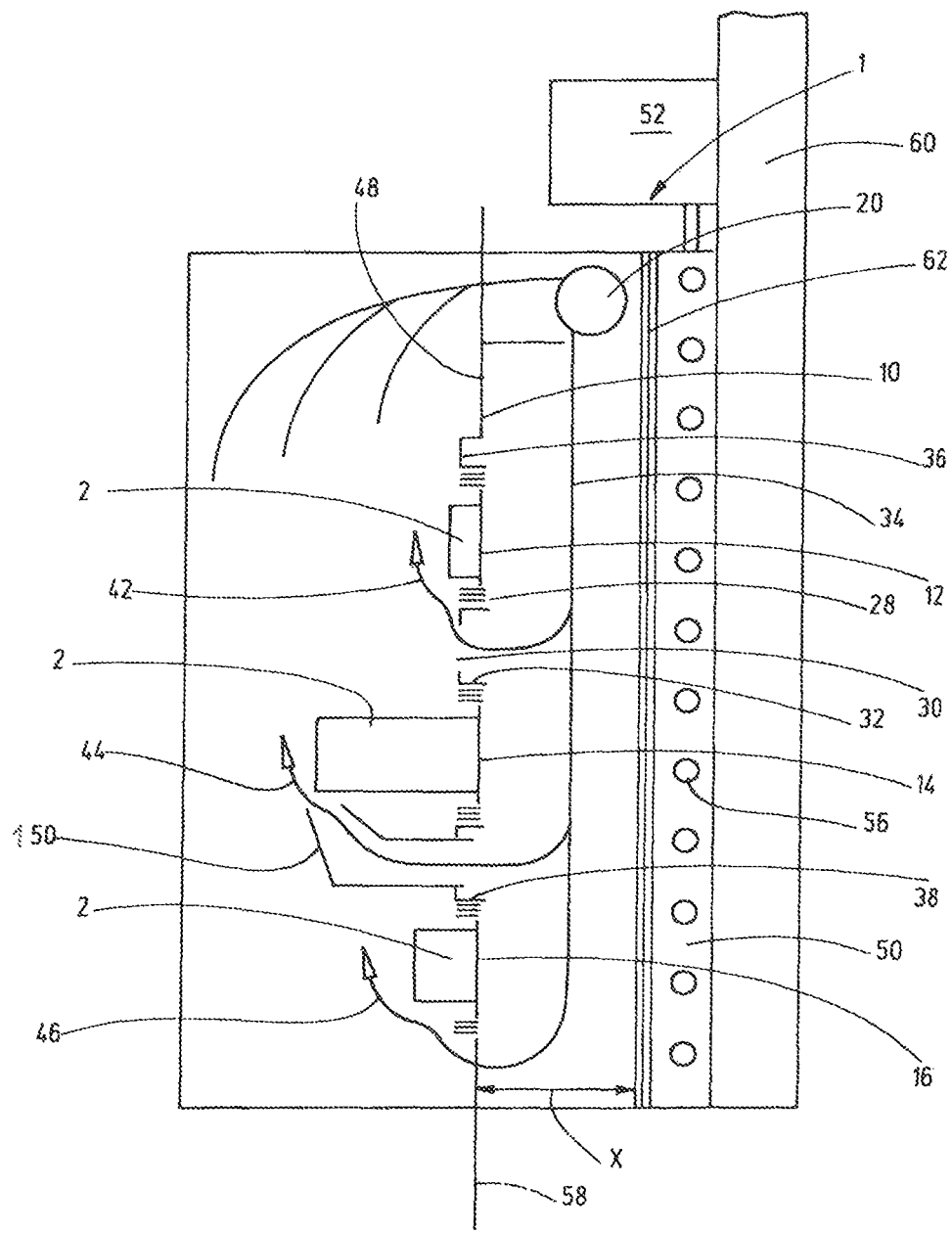
Figure 4:
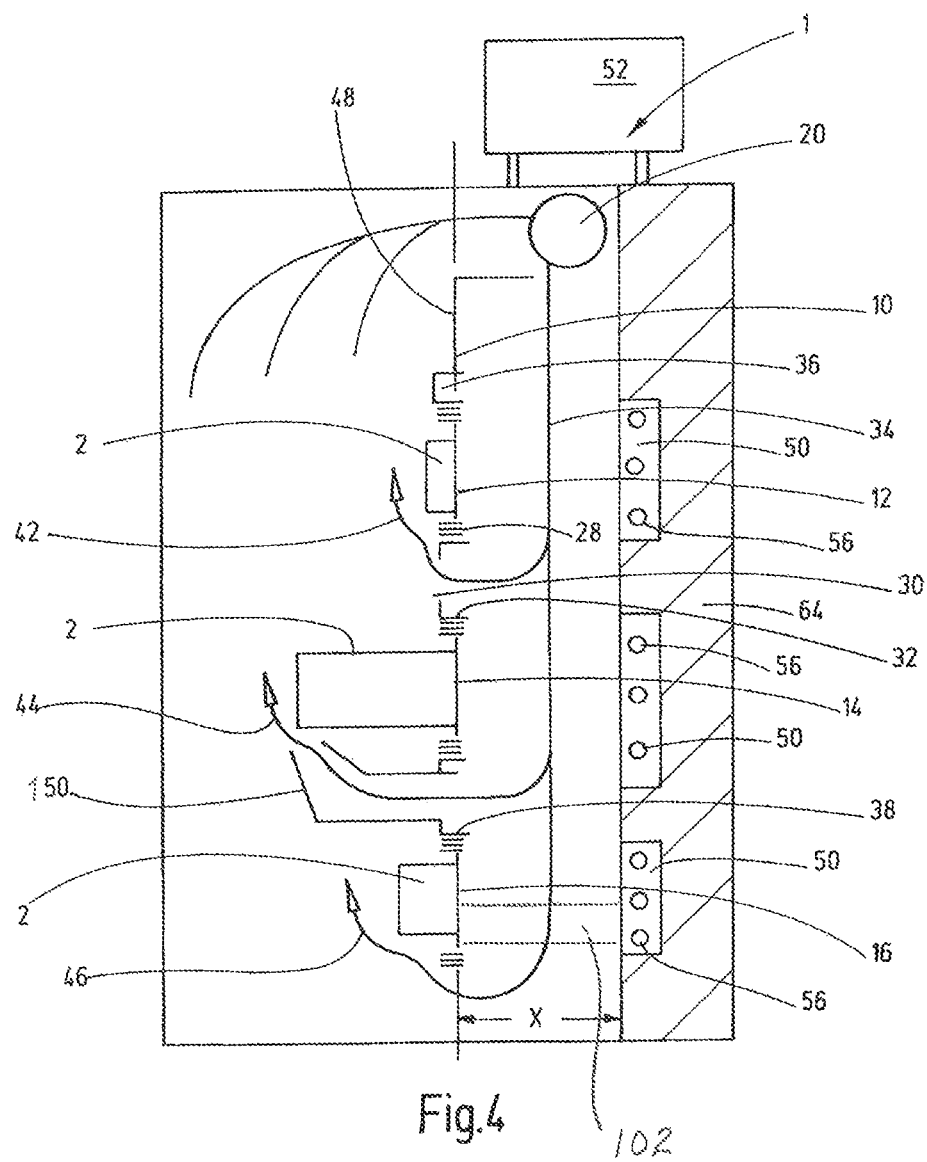

FIGS. 2 through 4 each show a highly simplified side view of an exemplary embodiment of the switch cabinet 1 according to the invention. The air conveying device 20 in each of the exemplary embodiments is designed as a crossflow fan or cylindrical fan and draws the air into the upper interior area of the switch cabinet 1 and conveys it to the rear side 19 of the frame 10, respectively, the support assembly 4. During its operation, the air conveying device 20 forces an air flow 34 directed from top to bottom on the rear side 19 of the frame 10. From the rear side 19 of frame 10, partial air flows 42, 44, 46 are separated off, which enter, for example, via the passage opening 30 from the rear side 19 of the frame 10 to the front side 17, on which the electrical devices 2 are arranged. On the front side 17, the partial air flows may then combine to form a complete air flow. The air routing is again displayed with arrows. The partial airflow 42 entering, for example, through the passage opening 30 brushes over the device 2 depicted to the upper left in FIG. 1, to which the passage opening 30 is accordingly allocated, even before the partial airflow 42 is able to combine with the additional air flows 44, 46 on the front side 17 of the frame 10. However, because of the heat to be dissipated from the devices 2 alone, a convective current in general forms on the front side 17 in the switch cabinet 1, which passes from top to bottom. Thus, the entire air flow on the front side is in turn drawn in above the devices 2 by the air conveying device 20 and transported via its outlet opening downward along the rear side 19 of the support assembly 4, so that a permanent circulation of the air in the closed switch cabinet 1 takes place.

A fastening element 48 is disposed in principle arrangement above the first mounting strip 12, to which the air conveying device 20 is connected, in particular, mounted. A first strip gap between the fastening element 48 and the first mounting strip 12 is sealed by a cover element 36, which essentially hermetically seals the frame 10 at this point. In contrast, a first cover element 32, which includes the passage opening 30, is arranged in the strip gap between the first mounting strip 12 and the second mounting strip 14. The first cover element 32 in this case may be insertable into the side margins of the strip gap bordered by the wiring strips 28. The passage openings 30 in this case may be predefined in the first cover element 32 or the first cover element 32 may include predetermined breaking points as a result of local material thinning, perforations or the like, by which the passage opening 30 may be easily produced if needed and preferably without tools. In a simplified construction, the passages between the individual mounting strips 12, 14, 16 may also be utilized to transport the air from the rear side 19 in the direction of the front side 17 for the purpose of air conditioning the devices 2.

Since the center device 2, depicted by way of example in FIG. 1, is comparatively tall overall, a second closure element 24 is inserted into the strip gap between the second mounting strip 14 and the third mounting strip 16. In the passage opening 30 of the second closure element 24 an air control element 150 is inserted, preferably detachably inserted. By the air control assembly, the passing cool air may be fed in a targeted manner to the front end of the second device 2. The air control element 150 may alternatively or in addition also distribute the cooled air in the horizontal direction in a corresponding manner.

Arranged below the third mounting strip 16 is a passage opening extending over the entire width of the third mounting strip 16. Through that passage opening, the remaining air flow 34 is able to pass from the rear side 19 to the front side 17 of the frame 10, is initially able to brush over the second device 2 (depicted at the bottom on the left hand side of FIG. 1) in a cooling manner, and is subsequently suctioned off in the direction of the air conveying device 20. The structure of the support assembly 4 or the frame 10 is merely exemplary. In practice, the components are fitted with significantly more mounting strips in horizontal and vertical alignment than are shown here by way of example for purposes of explaining the invention.

The air conditioning system according to the invention will now be described in greater detail, based on the previously described basic structures of a switch cabinet. As shown in FIG. 1, a heat sink 50, which air conditions, preferably appropriately cools the devices 2 located inside the switch cabinet 1, is arranged as an autonomous component on the rear side of the switch cabinet 1. The heat sink 50 shown in FIG. 1 is a spatially limited, autonomous body, which transfers the thermal energy stored in it or fed to it to an adjacent medium, such as preferably air. The heat sink 50 is preferably a cooling device, which dissipates heat waste in order to prevent the devices 2 in switch cabinet 1 from overheating.

In the exemplary embodiment according to FIG. 1, the heat sink 50 has a plate-shaped extension and preferably forms a wall section on the rear side of the switch cabinet 1. In this respect, therefore, the switch cabinet 1 is covered on its rear side by the heat sink 50 in such a way that the side walls of the heat sink 50 merge flush with the side walls of the switch cabinet 1. In its simplest embodiment, the heat sink 50 is designed as a "cold plate", which is accordingly able to store a low ambient temperature outside the switch cabinet 1 and then deliver it to the interior of the switch cabinet 1. As a result of this cooling of the heat sink 50 designed as a "cold plate", the previously described heat drop gradient on the rear side 19 of the switch cabinet 1 is increased.

As shown in the exemplary embodiment according to FIG. 2, the heat or temperature sink 50 may be designed as a cool plate of a cooling device, which cooperates, in particular, with an evaporator or a cold compression machine 52. According to the depiction in FIG. 2, machine 52 is arranged, together with its compressor and condenser, above the switch cabinet 1 on the outside thereof. The temperature of the cool air is preferably regulated in such a way that, if possible, no condensate forms on the evaporator even under unfavorable climate conditions. Any condensate appearing in the switch cabinet 1 is collected by a hollow rail-type collector device 54 and discharged from the switch cabinet 1 via an outlet device not further depicted.

For the layout, the concept of the heat sink 50 formed as a cooling plate is preferably designed in the form of a sandwich structure, made up of a plate-shaped carrier medium, in which preferably cooling coils or cooling lines, laid down in a meandering pattern, are imbedded. The flow line and return line of the cooling lines or cooling tubes 56, particularly adiabatic cooling tubes, are each connected to the cooling compressor 52, which, together with the associated condenser, is fixedly mounted outside the switch cabinet 1 on the top thereof, in order not to occupy any installation space inside the switch cabinet. The cooling tubes 56 are connected to the cold compressor 52 installed on top of the switch cabinet 1 by separable couplings not further depicted, as a result of which a simple maintenance of the cold compressor 52 is possible or individual components of the entire cooling system may be easily replaced once the compressor 52 is separated via the separable couplings from the remaining heat sink 50.

The following exemplary embodiments will be explained only to the extent that they differ significantly from the preceding exemplary embodiments. The statements made with regard to the former apply accordingly also to the exemplary embodiments according to FIGS. 3 and 4 presented below.

In the embodiment according to FIG. 3, the frame 10, i.e., the support assembly 4, is fastened in the switch cabinet 1 by a permanently installed servo axis 58. The actual frame 10 is vertically held on the servo axis 58. However, particularly preferably at an adjustable distance X to the cooled heat sink 50 arranged on the rear side. Furthermore, in the present exemplary embodiment, the heat sink 50 with the bottom connection is placed in front of a building wall 60, which may be part of an installation hallway for the switch box 1. The compressor 52 in such case is also attached to the building wall 60. The arrangement on the side of the wall may also extend along a larger hallway wall, so that multiple switch cabinets 1 with their hollow box design then remaining open on the rear side may be placed in front of the respective heat sink arrangement 50. When viewed in the direction of FIG. 3, a nano-varnish coating 62 is applied on the front side of the heat sink 50, which by itself allows the heat sink 50 to be cleaned of pollutants or accordingly facilitates cleaning in this area. In this case, the heat sink 50 could again join flush with the rear side of the switch cabinet 1 or overlap accordingly as an extension, in order in this way to enable installation options of multiple switch cabinets 1 (not depicted) for just one heat sink plate.

In the embodiment according to FIG. 4, multiple plate-shaped heat sinks 50 are each allocated to a device area 2 of the support assembly 4 and are otherwise protected to the rear against cold losses into the environment by an insulation 64. To the extent the preceding exemplary embodiments emphasize essentially the cool aspect, the respective heat sink 50 may also be provided for heat temperature control for the devices 2 of the switch cabinet 1, in order for example, to air condition in the sense of heating the devices 2 at installation locations of the switch cabinet 1 with very low temperatures, in order in this way to be able to rapidly ensure their functionality. Depending on the configuration, correspondingly designed heating lines carrying a heating medium also or alternatively appear in addition to the cooling tubes 56. An electrical heating of the heat sink 50 may also be contemplated.

Based on the modular design of each heat sink 50, a large number of applications for switch cabinets 1 can be implemented. Thus, the respective heat sink 50 may be integrated on the front of the door systems for the switch cabinet 1 not further depicted or to include the other wall sections thereof such as, for example support base parts, side walls and topside walls.

A predetermined distance X between the support assembly 4 and the heat sink 4 is adjustable by an adjusting device 102.

While various embodiments have been chosen to illustrate the invention, it will be understood by those skilled in the art that various changes and modifications can be made therein without departing from the scope of the invention as defined in the claims.

The invention claimed is:

1. An air conditioning system, comprising: a switch cabinet having a support assembly and a cabinet door on a cabinet front side of said switch cabinet, said supporting assembly having a support front side facing said cabinet front side and a support rear side facing away from said cabinet front side;
   electrical or electronic devices arranged in rows on top of and next to one another on said support front side to be air conditioned;
   a heat sink being a separately formed, autonomous component relative to and subsequently coupled to a cabinet rear side of said switch cabinet after said switch cabinet is formed and at least partially air conditioning said electrical or electronic devices, said cabinet rear side opposite to said cabinet front side;
   a rear flow space between said heat sink and said support rear side allowing a sinking air flow in said switch cabinet from a top to a bottom of said switch cabinet;
   a front flow space between said support assembly and said cabinet door allowing a rising air flow guided at least partially past said electric or electronic devices;
   openings in said support assembly, each of said openings enabling a direct cross connection from said rear flow space to said front flow space such that at least a respective one of said electrical or electronic devices is supplied with the rising air flow on said cabinet front side;
   an air conveying device circulating flow of the sinking air flow in said rear flow space from said top to said bottom of said switch cabinet and in partial flows through said openings from said rear flow space to said front flow space combining the partial flows in said front flow space over said electrical and electronic devices.

2. The air conditioning system according to claim 1 wherein
   said air conveying device comprises a cylindrical fan.

3. The air conditioning system according to claim 1 wherein
   said autonomous component comprises a spatially limited, autonomous body delivering energy stored therein or fed to said sinking air flow.

4. The air conditioning system according to claim 3 wherein
   said autonomous body comprises a cooling device dissipating waste heat to prevent said electrical or electronic devices from overheating.

5. The air conditioning system according to claim 1 wherein said heat sink comprises a plate-shaped extension, forms a wall section of said switch cabinet, and at least one of is integrable in said switch cabinet, or overlaps or covers said switch cabinet.

6. The air conditioning system according to claim 1 wherein
   an adjusting device adjusts a distance between said support assembly and said heat sink.

7. The air conditioning system according to claim 1 wherein
   said rear flow space has a volume smaller than a volume of said front flow space.

8. The air conditioning system according to claim 1 wherein
   a gaseous coolant is circulated through cooling tubes inside said heat sink, said heat sink being plate-shaped; and
   a compressor coupled to said heat sink compresses said gaseous coolant delivered to said compressor and transfers heat to a surrounding environment.

9. The air conditioning system according to claim 1 wherein
   a front side of said heat sink facing said support assembly comprises a nanostructure.

10. The air conditioning system according to claim 9 wherein
    said nanostructure comprise a nano-varnish.

11. The air conditioning system according to claim 1 wherein
    a condensation collector is mounted in said switch cabinet, collects condensate forming during operation of said heat sink and has an outlet discharging the condensate from said switch cabinet.

12. The air conditioning system according to claim 1 wherein
    said support device and heat sink are spaced apart from one another by a distance that is adjustable.

* * * * *